United States Patent
Amaratunga et al.

(10) Patent No.: US 8,053,783 B2
(45) Date of Patent: Nov. 8, 2011

(54) SWITCHING DEVICE

(75) Inventors: Gehan Anil Joseph Amaratunga, Cambridge (GB); Mihai Brezeanu, Cambridge (GB); Jeremy Suhail Rashid, Cambridge (GB); Nalin Lalith Rupesinghe, Cambridge (GB); Antonella Tajani, London (GB); Daniel James Twitchen, Sunningdale (GB); Florin Udrea, Cambridge (GB); Christopher John Howard Wort, Wantage (GB)

(73) Assignee: Element Six Limited, Isle of Man (GB)

( * ) Notice: Subject to any disclaimer, the term of this patent is extended or adjusted under 35 U.S.C. 154(b) by 404 days.

(21) Appl. No.: 11/575,114

(22) PCT Filed: Sep. 8, 2005

(86) PCT No.: PCT/IB2005/002654
§ 371 (c)(1),
(2), (4) Date: Jun. 8, 2007

(87) PCT Pub. No.: WO2006/027669
PCT Pub. Date: Mar. 16, 2006

(65) Prior Publication Data
US 2008/0203397 A1 Aug. 28, 2008

Related U.S. Application Data

(60) Provisional application No. 60/621,066, filed on Oct. 25, 2004.

(30) Foreign Application Priority Data

Sep. 10, 2004 (GB) .................................. 0420177.8

(51) Int. Cl.
*H01L 31/10* (2006.01)
*H01J 47/00* (2006.01)
(52) U.S. Cl. .................. 257/77; 257/437; 257/E31.053

(58) Field of Classification Search ............... 257/77, 257/431, E31.033, 437, 438, 481, E31.011, 257/E31.014, E31.053, E31.065, E31.089; 200/61.03; 438/571
See application file for complete search history.

(56) References Cited

U.S. PATENT DOCUMENTS 5,086,014 A    2/1992  Miyata et al.
(Continued)

FOREIGN PATENT DOCUMENTS

EP          0 458 530        11/1991
(Continued)

OTHER PUBLICATIONS

Twichen, D. J. et al.,"High-Voltage Single-Crystal Diamond Diodes", IEEE Transanctions on Electron Devices, vol. 51, No. 5, pp. 826828, 2004.

(Continued)

*Primary Examiner* — Thomas L Dickey
*Assistant Examiner* — Fazli Erdem
(74) *Attorney, Agent, or Firm* — Oblon, Spivak, McClelland, Maier & Neustadt, L.L.P.

(57) ABSTRACT

A high voltage diamond based switching device capable of sustaining high currents in the on state with a relatively low impedance and a relatively low optical switching flux, and capable of being switched off in the presence of the high voltage being switched. The device includes a diamond body having a Schottky barrier contact, held in reverse bias by the applied voltage to be switched, to an essentially intrinsic diamond layer or portion in the diamond body, a second metal contact, and an optical source or other illuminating or irradiating device such that when the depletion region formed by the Schottky contact to the intrinsic diamond layer is exposed to its radiation charge carriers are generated. Cain in the total number of charge carriers then occurs as a result of these charge carriers accelerating under the field within the intrinsic diamond layer and generating further carriers by assisted avalanche breakdown.

35 Claims, 2 Drawing Sheets

U.S. PATENT DOCUMENTS

| | | | | |
|---|---|---|---|---|
| 6,080,378 | A | * | 6/2000 | Yokota et al. ................ 423/446 |
| 6,734,515 | B1 | * | 5/2004 | Tadatomo et al. ............ 257/431 |
| 2003/0131787 | A1 | * | 7/2003 | Linares et al. ................. 117/93 |

FOREIGN PATENT DOCUMENTS

| WO | 01 91187 | 11/2001 |
|---|---|---|

OTHER PUBLICATIONS

Davidson, J. L. et al., "Development of Diamond Based Power Microelectronics", Mat. Res. Soc. Symp. Proc., vol. 483, pp. 53-61, 1998.

* cited by examiner

SWITCHING DEVICE

BACKGROUND OF THE INVENTION

This invention relates to a switching device, and in particular to a photoconductive or other irradiation activated switching device fabricated from diamond.

The ideal high voltage switch provides a perfect current block in the 'off' state, able to withstand the high voltages applied without breakdown, and in the 'on' state has zero impedance to the current being switched, even where this current is high. All practical switching materials and devices fall short of this ideal, and an area of particular difficulty is in switches required to withstand both high voltages in the 'off' state and high currents in the 'on' state.

As the voltage rating of a system incorporating a high voltage switch increases, the switch used needs to withstand higher voltages in the off state, such that the reverse blocking capability of the switch needs to be as high as possible. Using silicon for such a switch would involve excessively large voltage blocking layers, which may not be realistically possible (especially if reverse voltages in excess of 10 kV are involved), as this will lead to large on-resistances. Whilst high blocking voltages are sustainable in suitable high quality diamond material, the problem of using such material has been in terms of a limited current capability and a relatively high impedance in the on state, these two problems being related.

The applications of such switches are considered in certain prior art references. For example, U.S. Pat. No. 6,239,514 discusses the general concept of using an optically or radiation activated switch in parallel with a mechanical switch, the optically or radiation activated switch relieving the mechanical switch from inductive arcing as the mechanical switch is opened. U.S. Pat. No. 6,140,715 describes a structure where the radiation activated switch is based on a PIN diode structure. Other prior art references consider radiation activated switches in more detail, for example, U.S. Pat. No. 6,194,699 concerns itself with the problem of shadowing, where the contact structure on the side of the device on which the radiation beam impinges shadows the important region of the contact with the intrinsic semi-conductor material to which it makes contact. It proposes a solution of providing an additional layer at this surface that permits mobility of the carriers and that may bury the contacts. U.S. Pat. No. 6,222,141 proposes an alternative solution to this problem, laterally displacing electrode structures on opposite major faces and irradiating both major faces, so that no region is in shadow from both sides.

A third area of concern addressed in the prior art is the provision of a device in which the applied voltage may remain in the same direction for both conducting and blocking states, and in which carrier injection is simplified. U.S. Pat. No. 6,204,522 thus covers the use of an intermediate layer such as SiC between the contacts and the intrinsic wide band gap material such as diamond. Such SiC layer generates carriers under lower energy radiation, and by controlling the injection of carriers enables the device to turn off under high applied voltage as the radiation source is removed. However, such devices are difficult and expensive to fabricate, being reliant on a high quality hetero-epitaxial interface between the diamond and the SiC.

SUMMARY OF THE INVENTION

A switching device comprising:
a diamond body;
at least one first metal contact to the diamond body, said first metal contact being a Schottky contact and forming a depletion region in an adjacent region of the diamond body when held in reverse bias by an applied voltage to be switched;
at least one second metal contact to the diamond body arranged to carry a current from the switching device, said second metal contact generally being an ohmic contact; and
illuminating or irradiation means arranged to illuminate or irradiate the depletion region in the diamond body adjacent to the Schottky contact, thereby to commence generation of carriers that are capable of carrying a current, wherein the diamond body includes a portion of intrinsic diamond in contact with the at least one first metal contact, the intrinsic diamond being characterised by having sufficiently low levels of impurities including dopant atoms such as boron, such that the electronic properties are dominated by intrinsic carriers, and in having high carrier mobilities and lifetimes for such carriers.

BRIEF DESCRIPTION OF THE DRAWINGS

The invention will now be described in more detail, by way of example only, with reference to the accompanying drawings in which.

DETAILED DESCRIPTION OF PREFERRED EMBODIMENTS

Figure 1:
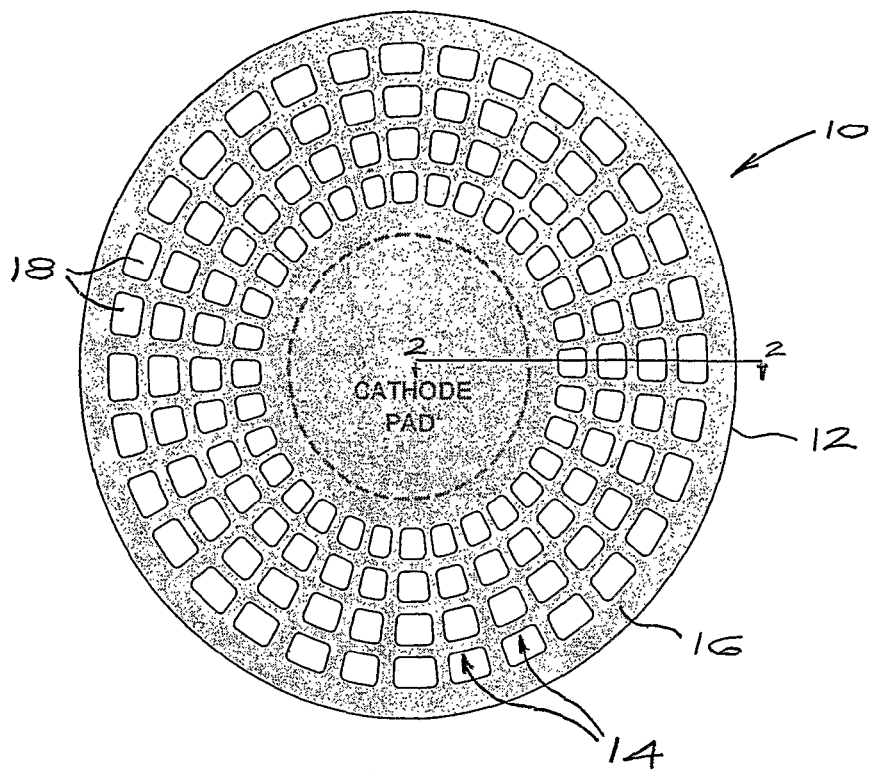
FIG. 1 is a plan view of an embodiment of a switching device of the invention.

The device of the invention is a high voltage diamond based switching device which is capable of sustaining high currents in the on state with a relatively low impedance and a relatively low optical switching flux, and preferably also capable of being switched off in the presence of the high voltage being switched.

The switching device comprises a diamond body, at least one first metal contact, which is a Schottky barrier contact held in reverse bias by the applied voltage to be switched, to an essentially intrinsic diamond layer or portion in the diamond body, preferably synthesised by chemical vapour deposition (CVD), at least one second metal contact to the diamond body and illuminating or irradiating means, typically an optical source. The depletion region formed by the Schottky contact to the intrinsic diamond layer is exposed to radiation from the illuminating means, which generates charge carriers. Gain in the total number of charge carriers then occurs as a result of these charge carriers accelerating under the field within the intrinsic diamond layer and generating further carriers in the manner of assisted avalanche breakdown.

In a preferred embodiment of the invention, the switching device comprises four key components, as set out below:
i) An essentially intrinsic or high purity diamond layer providing two major surfaces, the thickness between those surfaces being engineered to ensure the applied voltage in the application of the device is below that for spontaneous avalanche breakdown in the diamond.

ii) A Schottky barrier contact on one major surface of the intrinsic diamond layer, preferably formed by a perforated metal layer or by other means made semi-transparent to the radiation used for switching or controlling the device, the Schottky contact being held in reverse bias in the off state of the switch by the high voltage to be switched.

iii) A second contact on the second major face of the intrinsic diamond layer, said contact preferably being an ohmic contact and more preferably formed by use of a heavily doped diamond layer in combination with a metal contact.

iv) An optical source providing one or more selected wavelengths of light that can generate carriers in the diamond and is used to switch the device. The optical source is so arranged as to illuminate at least a portion of the depletion layer formed by the Schottky contact. The illumination preferably passes through the perforated metal layer forming the Schottky contact.

The diamond used for the device can be synthetic single crystal diamond produced by either a chemical vapour deposition (CVD) technique or a high pressure-high temperature (HPHT) technique, natural diamond, heteroepitaxial diamond, or any form of polycrystalline diamond prepared using a CVD technique, provided that the carrier mobilities and carrier lifetimes are sufficiently high for the device to function. In a preferred embodiment, single crystal CVD diamond is used, since this form of diamond generally provides the greatest control over consistent high carrier mobilities and lifetimes.

The efficient and reliable operation of diamond electronic devices is highly dependent on the state of the surfaces upon which the electrodes are prepared. It is necessary to ensure that the surfaces are prepared with very low densities of crystal defects and impurities as these can cause traps that result in poor contact characteristics. In a preferred embodiment, the surfaces are initially prepared by lapidary techniques employing progressively finer grits, polished using a resin bond wheel, and then finally are plasma etched to remove the thin mechanically damaged layer that remains. The material is thoroughly cleaned in a hot oxidising acid mixture to ensure that any non-diamond carbonaceous material is removed from the surfaces.

Control of the surface roughness at interfaces can also be important, and this is particularly true for the Schottky contact. For a preferred embodiment where low roughness surfaces are desirable, the surface roughness, characterised by its Ra and measured with a non-contact probe such as an atomic force microscope, is typically less than 1.0 nm and can be as low as 0.3 nm. However, in some applications interface surfaces with higher roughness, and even with deliberately controlled levels of roughness, may be utilised. There is substantial difficulty, however, in producing interfaces which are rough but free of crystal defects.

The first, Schottky barrier, contact is made by depositing a suitable metal directly on to the surface of the diamond using a technique such as sputtering or evaporation, but not excluding other techniques known in the art for depositing thin metallic layers. Suitable metals for the Schottky contact include Al and Au, but other non-carbide forming metals are also suitable. By using a sputtering technique for Schottky contact deposition, any terminating layers on the diamond surface are removed prior to metal deposition ensuring improved performance, adhesion and reliability.

The second, ohmic, contact is made by depositing a thin (less than 5 nm) layer of a carbide-forming metal such as Ti, W or Cr and then overcoating with a capping layer of Au having a thickness of up to 5 µm. Optionally a thin diffusion barrier layer (up to about 10 nm thick) of Pt can be deposited on the exposed surface of the carbide-forming metal layer. The deposition of the contact metal(s) is preferably accomplished by a sequence of sputtering operations such that the interfaces are not contaminated with, in particular, oxygen. Such techniques are known in the art.

The openings in the electrodes, such as are illustrated in FIG. 1, are prepared by lithographic techniques known in the art. The dimensions of the devices and features are such that both 'lift-off' and 'etch-back' techniques are applicable. However lift-off is preferred as it avoids problems associated with metal carbide films adhering to the diamond that cannot be removed without highly aggressive chemical or plasma treatment that is incompatible with the metallisation.

The lateral dimensions of the device control the total power handling capability, whilst the thickness limits the maximum voltage that can be applied before breakdown occurs. Typical dimensions for the device illustrated in FIG. 1 are a diameter of more than 2 mm and less than 20 mm with a total thickness of between 0.2 mm and 2 mm. The device illustrated in FIGS. 3 and 4 would typically have lateral dimensions of between 2 mm by 2 mm and 20 mm by 20 mm. Whilst these dimensions are typical, they are not limiting.

In an alternative embodiment the radiation source is not optical, but is any other irradiation source which can provide carrier generation when interacting with the diamond, for example x-rays, electrons, alpha particles and the like. The use of such 'penetrating' radiation obviates the need for the openings in the metallisation of FIG. 1, but does make the practical operation of the device more complex as the radiation source may be more difficult to handle. The use of electro-magnetic radiation is preferred, and more preferably radiation lying in the range of 180 nm-500 nm wavelength.

The switching device of the invention is generally operated in the following manner, the description being based on the preferred embodiment using an optical source for switching.

In the off state there are no carriers present in the intrinsic diamond, and with the junction of the Schottky contact held in reverse bias there are no carriers generated here either. Having selected the thickness of the diamond layer to be below avalanche breakdown at the applied electric field, the device holds off the applied voltage with essentially no current flowing.

On application of the optical source to the depletion layer of the Schottky contact, preferably by illuminating the major surface of the device with the perforated and thus semi-transparent Schottky cathode contact, the optical energy in the illuminating beam generates carriers in the intrinsic diamond layer. The electron charge carriers produced are accelerated by the applied field into the volume of the intrinsic diamond layer and result in assisted avalanche breakdown of the intrinsic diamond layer. This effect provides gain in the total number of carriers (electron and hole) available for carrying the current. In the presence of the carriers and the current they carry, the applied field is reduced to the point where the assisted avalanche breakdown is just sufficient to provide the necessary carriers. The field required to sustain sufficient levels of avalanche breakdown in the presence of an optical source generating carriers in the depletion layer of the Schottky contact is much smaller than that for spontaneous avalanche breakdown, and so although a small self-regulating voltage remains across the device the efficiency of the device is sufficiently high to be acceptable.

On removal of the optical source the generation of carriers in the region of the Schottky contact depletion layer is terminated, and the cascade of electrons being generated in the near Schottky region moves down to the second metal contact or anode until the intrinsic diamond is depleted of carriers, thus turning the device off.

This device has a number of benefits over prior art devices. The on state is achieved and maintained by a relatively low level of optical pumping, since the majority of carriers are generated by assisted avalanche breakdown. However, the use of a Schottky blocking contact excludes the generation or injection of additional electron charge carriers in the absence of the optical pumping, thus causing the device to turn off. As a result a fully optically controlled switch is formed using a much lower level of optical intensity to drive it than in other switch designs, whilst still providing a high current capability and a low on voltage. In addition, the device is very fast because of the intrinsic carrier properties of diamond, and the device can be low loss, avoiding the electron-hole recombination problems present in other bipolar devices. Furthermore, the device is simple and reliable to fabricate, not requiring both p and n-type doping, and not requiring heteroepitaxial layers such as SiC.

The energy of the optical wavelength used may be above-bandgap (i.e. with sufficient energy to excite an electron across the bandgap, implying a wavelength below about 230 nm), in which case the absorption in the diamond is strong and the carriers are generated within the first few μm of the diamond exposed to the optical beam. Such a beam is particularly applicable when the illumination is through the perforated, or by other means, semi-transparent Schottky contact, providing high levels of optical excitation in the region of the depletion layer.

Alternatively the optical wavelength may be sub-bandgap, in which case the beam is generally transmitted into the diamond and absorption occurs mainly at defects located in specific carrier generation layers, which comprises an alternative embodiment of the invention described in more detail below.

A further alternative is that the optical wavelength used may be near bandgap, its behaviour then sensitive to the exact wavelength used but able to show some combination of the benefits of the other alternatives above. For example, it may provide a means of tailoring the penetration depth and the profile of carrier generation in the intrinsic diamond or carrier generation layers.

Yet a further alternative is to use more than one optical wavelength in combination, with the ratio between the different wavelength intensities itself a potential variable in the control of the device.

As mentioned above, an alternative embodiment of the device comprises the additional feature of one or more layers within the otherwise intrinsic diamond layer which contain selected defects or impurities to enhance the interaction with the optical beam and the generation of carriers, and is particularly applicable when the energy of the illumination provided to generate carriers is below band-gap. The defects or impurities used in such carrier generation layers need to be selected so as to provide suitable absorption for the optical wavelengths used, to enable such wavelengths to generate carriers in the conduction band, at least under the applied field remaining when the device is in the on state, and to minimise any detrimental effect on the lifetime and the mobilities of the carriers. A carrier generation layer may be placed in the immediate vicinity of the Schottky contact, for example within the depletion layer, to modify and enhance the generation of carriers in this region. Alternatively or additionally, carrier generation layers may be placed in the bulk of the otherwise intrinsic diamond layer, a preferred version being a regularly spaced sequence of layers, enhancing the generation of carriers throughout the volume of the intrinsic diamond layer. The particular advantage of such a device is the ability to efficiently turn on the device with light having energies substantially lower than that of the diamond bandgap. Suitable impurities from which to form defects in a carrier generation layer include H, B, N, and P. A particular example is the addition of nitrogen to the CVD diamond growth process which produces broad absorption bands near the band edge including a broad peak starting at 220 nm, ending at 325 nm and peaking at 270 nm, and a background absorption rising at shorter wavelengths according to the form: Absorption coefficient $(cm^{-1})=C\times\lambda^{-3}$ (C=constant, $\lambda$ in μm).

An alternative geometry of the invention may be realised using a planar geometry, when Schottky contacts are placed on the surface of a diamond wafer with spacing between them, which supports voltage. Incidence of light into the intermediate diamond surface region then causes an increase of current and the lowering of the voltage. In this embodiment the voltage supported between the surface contacts is related to the physical spacing between them. In order to obtain the maximum possible relative reduction in voltage when conducting current under conditions of incident light, it is necessary to reduce the spacing within the limits of manufacturing constraints. In such a case, the voltage that can be sustained by a single pair of spaced Schottky contacts is limited. However, by connecting pairs of Schottky contacts in series a proportional increase in the terminal voltage supported by the composite Schottky barrier structure can be increased.

Referring now to FIG. 1 an optically addressable switch 10 of the invention is essentially formed from a Schottky Barrier Diode (SBD) 12. The optical SBD 12 is similar to a conventional SBD with the inclusion of one or more windows 14 etched into the first metal contact or cathode contact 16. Typically the Schottky metal used on the cathode 16 is gold (although other non-carbide forming metals such as Al may be suitable according to the application), with a work function of about 4.9 eV and is placed on a diamond layer 18 (seen through the windows 14) whose doping level is sufficiently low to be essentially intrinsic in behaviour.

The total level of impurities in the intrinsic layer 18 (excluding hydrogen and excluding any discrete carrier generation layers present) is below 5 ppm, and preferably below 1 ppm, and more preferably below 0.3 ppm, and more preferably below 0.1 ppm, and more preferably below 0.03 ppm, and most preferably below 0.01 ppm. More importantly, the level of each of the specific three doping impurities, boron, phosphorus and sulphur in the intrinsic layer 18 is less than 0.1 ppm, and more preferably less than 0.03 ppm, and more preferably less than 0.01 ppm, and more preferably less than 0.003, and most preferably less than 0.001 ppm. Material particularly appropriate for use as the intrinsic layer is described in WO0196633, which contains low impurities and exhibits high mobilities and lifetimes.

Figure 2:
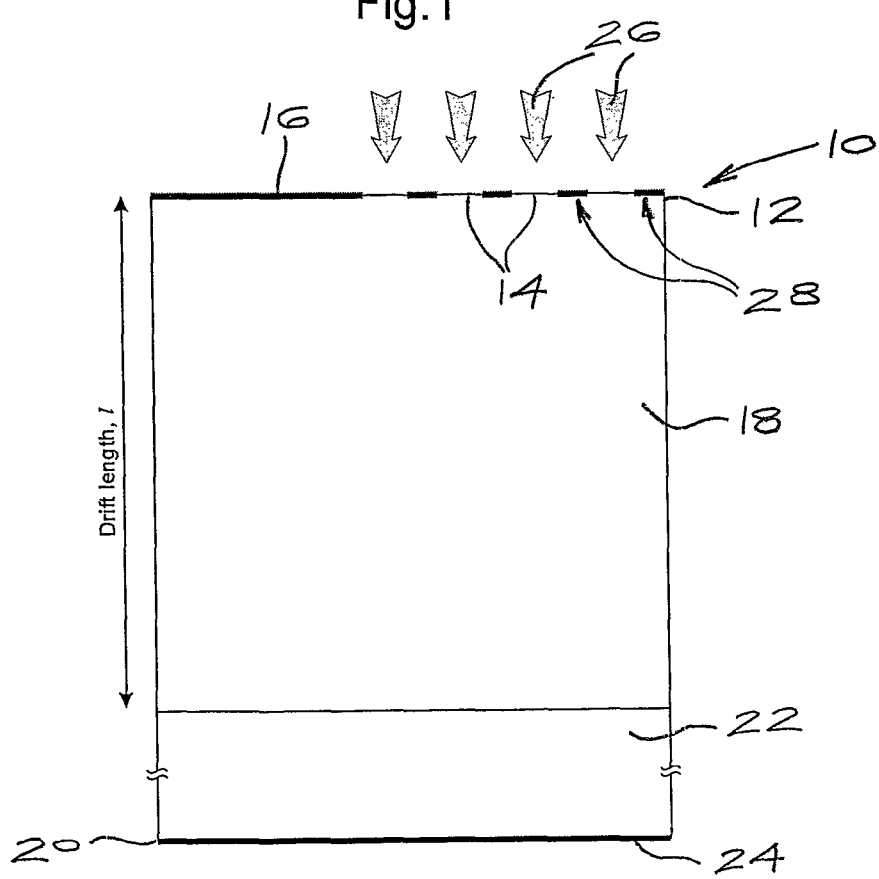
FIG. 2 is a cross-section along the line 2-2 of FIG. 1.

As shown in FIG. 2, the anode 20 is in part formed by a highly doped diamond layer 22, preferably a highly boron doped diamond layer. The dopant level preferably exceeds 10 ppm, and more preferably exceeds 30 ppm, and more preferably exceeds 100 ppm, and more preferably exceeds 200 ppm and most preferably exceeds 500 ppm, and preferably does not exceed 20,000 ppm and more preferably does not exceed 10,000 ppm, and more preferably does not exceed 5,000 ppm, and more preferably does not exceed 2,000 ppm, and most preferably does not exceed 1000 ppm. The anode 20 further comprises a metal contact 24 to which a circuit connection (not shown) can be made, for example by wire bonding.

The optical illumination 26 from an optical source (not shown) initiates and controls the avalanche multiplication phenomenon that occurs at breakdown within the diode, for example by shining through the patterned windows 14 in the cathode contact 16. With the SBD 12 held in reverse bias close to breakdown, a small concentration of electron hole pairs created in the depletion region 28 from an incident photon flux is enough to push the system into avalanche mode. The high mobilities and lifetimes now possible in diamond, for example, electron and hole mobilities of 4500 and 3800 $cm^2/V$-s, respectively, and lifetimes of around 100 ns allows a low applied field to sustain the avalanche effect once established and the optical excitation maintained. In the absence of the optical excitation in the depletion region 28 of the Schottky barrier junction, the electric field which can be supported is that just below spontaneous avalanche breakdown. High purity diamond has the highest known threshold for spontaneous avalanche breakdown of any semiconductor with values exceeding 20 MV/cm. This is particularly suited to an optical device designed to support high voltage in the off state.

A variety of means may be used to assist in reducing shadowing effects by the Schottky electrode structure over the region of the depletion layer including those noted earlier and others described in the art. When the optical excitation is intended to interact with the depletion region of the Schottky contact and is shone through a perforated Schottky contact, the degree of interaction is in part controlled by the precise design of the contact perforations. As diamond has a very high refractive index, the angle of total internal reflection in diamond is 22.4°. Thus, where the medium external to the diamond is air, then whatever the angle of illumination external to the diamond, the light within the diamond is restricted to a cone angle of half angle 22.4°. At the wavelengths of interest, typically 200-500 nm, the effects of refraction are generally small. The interaction between the incident light and the depletion region is then best enhanced by selecting a wavelength whose absorption depth is similar in scale to or slightly larger than the depth of the depletion region of the Schottky contact and then generating perforations or apertures in the Schottky contact which have a similar lateral dimension to the absorption depth of the illumination.

Alternatively, the diamond surface on which the Schottky contacts are made need not be planar, but could comprise non-planar features such as trenches, rectangular pyramids or other geometric features designed to assist in the irradiation source, and in particular an optical source, exposing more or all of the depletion region. In this embodiment, the preferred structure is for the Schottky contacts themselves to lie on coplanar surfaces with the geometric features between them providing refraction of the optical beam to assist in exposure of the depletion region, the high refractive index of diamond then being beneficial. An alternative structure is where the Schottky contacts themselves lie on features which are not co-planar with the overall surface, and this alone or in combination with features provided to refract the excitation beam improves exposure of the depletion region. Careful design allows the use of dispersive behaviour at the diamond interface to modify the distribution of different wavelengths in the diamond. In addition, the use of coatings such as anti-reflection coatings on some or all of the surfaces of the device through which the light enters may be beneficial, reducing reflection at the surface or modifying refraction behaviour. A particular surface design structure which may be used is the fabrication of a diffraction grating structure onto regions or over the whole of the diamond surface, with the Schottky contacts then positioned on adjacent regions with the depletion layer illuminated by the diffraction grating, or with the Schottky contacts constructed on periodic features within the diffraction grating design. Particularly where non-optical forms of irradiation beam are used, oblique irradiation at one or more orientations will provide enhanced excitation of the depletion region.

A further means of excitation, particularly where sub-band gap optical excitation is used in conjunction with carrier generation layers, is illuminating from the side of the device. This can be done in a variety of ways, with the impinging beam provided from one side, or using a vertically impinging beam entering one major face and with a near 45° facet positioned on the opposite major face of the diamond to internally reflect the beam into the region of interest. The high refractive index of diamond can also be used to greater advantage, since by injecting optical radiation through a facet on the diamond plate which is further than 22.4° from the orientation of any of the major and orthogonal faces of the plate the light becomes internally trapped by total internal reflection until either absorbed or re-emitted at the facet of entry. Such means is an excellent way of enhancing optical pumping in diamond for a variety of applications.

A further alternative is to provide light entry into the diamond of the device such that it impinges on the Schottky junction surface close to the critical angle of diamond, such that the light is guided internally and parallel to the surface of the diamond. This configuration again works best where the optical excitation is below bandgap and in combination with a carrier generation layer within or near the depletion layer of the Schottky junction.

Further optimisation of the device can be achieved by considering the field enhancement near the Schottky contact generated by the apertures in it. High local fields, generated by increasing the spacing and sharpness of features in the Schottky contact, can reduce the applied voltage threshold at which avalanche breakdown occurs. Conversely, low applied levels of optical illumination can generate carriers below the critical level required for breakdown but sufficient to partially screen out such local high fields and thus return the applied voltage threshold at which avalanche breakdown occurs to near the value achievable in the absence of any field non-uniformities.

These effects provide a further mode of operation of the device of the invention, which is a device in which the voltage threshold for avalanche breakdown is controlled by optical means. Combining the two modes of operation, the optical intensity used to switch the device may not sit at zero in the off state, but switch to a lower value below the avalanche threshold, possibly with an excursion to an even lower value or to completely off to move the device from the on state to the off state. This type of effect can be used to increase the applicability of this device in high voltage switching modules where multiple isolated switches are used, obtaining different behaviour from each switch by applying different optical control parameters.

Further embodiments of the invention include the use of more than one wavelength of light, for example using one wavelength at low intensity to control the locally enhanced fields and thus the spontaneous breakdown voltage and another to switch the device to the on state.

Figure 3:
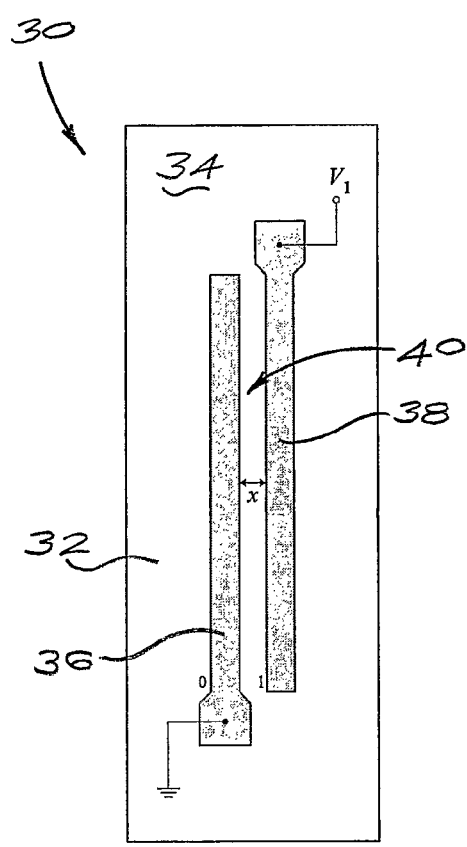
FIG. 3 is a plan view of a further embodiment of a switching device of the invention.
Figure 4:
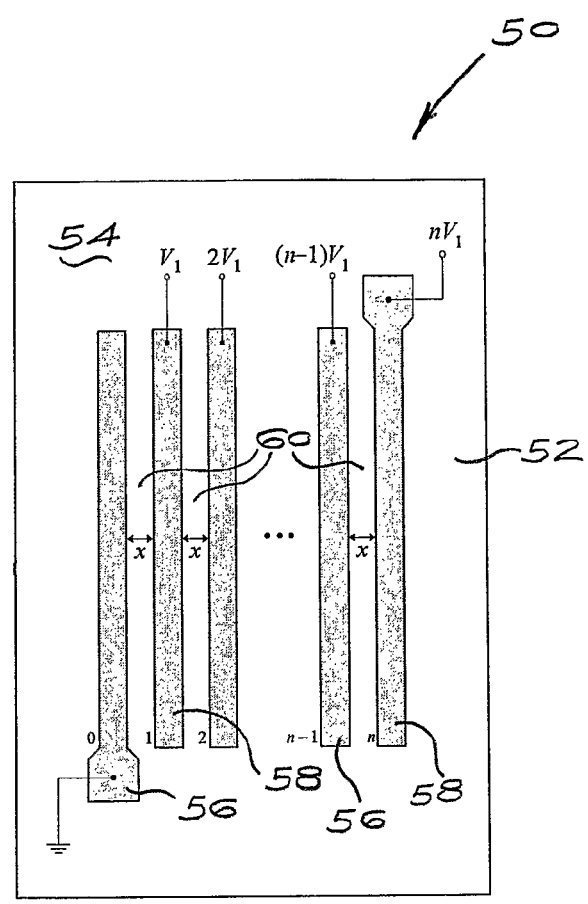
FIG. 4 is a plan view of another embodiment of a switching device of the invention.

Referring to FIGS. 3 and 4, alternative switching devices 30, 50 of the invention are shown in plan view. The switching device 30 of FIG. 3 is a single surface Schottky barrier switch consisting of a diamond body 32 having an upper surface 34 in contact with a pair of contacts 36, 38 spaced from one another by a distance x, and defining a region 40 that supports voltage. Incidence of light into the region 40 causes an increase of the current and the lowering of the voltage. The nominal electric field for this device is $E=V_1/x$.

The switching device 50 of FIG. 4 is a multiple surface Schottky barrier switch consisting of a diamond body 52 having an upper surface 54 in contact with several pairs of contacts 56, 58 connected in series, the contacts being spaced from one another by a distance x, and defining several regions 60 that support voltage. Incidence of light into the regions 60 once again causes an increase of the current and the lowering of the voltage. The nominal electric field of this device is $E=V_1/x$, where the terminal voltage is $nV_1$, with (n+1) Schottky barriers.

The invention will be further illustrated by way of the following non-limiting example.

Example 1

The device of the invention has been modelled using ISE-TCAD simulations, and using the following conditions:

Optical excitation by 0.225 μm light, using an absorption coefficient at 300 K of 12 cm$^{-1}$, and beam intensities of $0.88\times10^{-3}$ W/cm$^2$ to $0.88\times10^2$ W/cm$^2$. The Schottky cathode contact comprised a gold contact, with a characteristic lateral dimension of 2.5 μm, with 2.5 μm spacing. The Schottky barrier height was 1.87 eV. The intrinsic diamond layer, called the drift layer, onto which this contact bonded was modelled as containing $1\times10^{13}$ cm$^{-3}$ activated B atoms since a layer modelled with zero extrinsic carriers was unrealistic, with then a boron doped layer with $1\times10^{19}$ cm$^{-3}$ activated B atoms and a metal contact were used to form the ohmic anode contact. The thickness of the drift layer was varied from 0.2 μm-18 μm.

The majority of the light is absorbed in the first 2 μm of diamond, although the absorption tail extends beyond 5 μm. This is due to the low absorption coefficient and the fact that diamond is an indirect band-gap material.

In the off state, with a positive voltage applied to the cathode and the anode held at 0 V, the maximum field supported for a drift length of 4 μm is approximately 4.6 MV/cm reduced from the limiting value of diamond by the local field non-uniformity. With a drift length of 2 μm, and with no optical excitation, the cathode current density is about $1.3\times10^{-9}$ A/cm$^2$. This rises by more than seven orders of magnitude to about $7\times10^{-1}$ A/cm$^2$ when the optical beam is applied with a power density of 0.88 W/cm$^2$.

For a given drift length, by varying the optical beam intensity, a variation of the breakdown voltage can be observed. In Table 1 the values of the breakdown voltages for two drift lengths are presented and a small increase of BV with the light power density can be noticed. This is due to the fact that by increasing the concentrations of carriers in the drift region the potential lines have a more uniform distribution. This makes the electric field slightly more uniform and, as a consequence, induces a small increase of the breakdown voltage.

TABLE 1

| Beam power density (W/cm$^2$) | Breakdown Voltage (V) for 5 μm drift length | Breakdown Voltage (V) for 18 μm drift length |
|---|---|---|
| 0 (No light) | 274.9 | 813.2 |
| $0.88 * 10^{-3}$ | 279.4 | — |
| $0.88 * 10^{-2}$ | 284.1 | — |
| $0.88 * 10^{-1}$ | 286 | 815.7 |
| $0.88 * 10^{0}$ | 288.2 | 837.2 |
| $0.88 * 10^{1}$ | — | 854.3 |

By decreasing the drift length this effect becomes less significant, and for drift lengths of 0.2 μm-0.3 μm the reverse phenomenon can be observed (Table 2). A decrease of the breakdown voltage when increasing the beam power density means that the light-triggered Schottky diode gets into avalanche for a smaller cathode voltage if illuminated compared to the dark case; under such circumstances the device can be turned-on earlier when it is illuminated.

TABLE 2

| Beam power Density (W/cm$^2$) | Breakdown Voltage (V) for 0.2 μm drift length |
|---|---|
| 0 (No light) | 41.7 |
| $0.88 * 10^{-3}$ | 40.5 |
| $0.88 * 10^{-2}$ | 39 |
| $0.88 * 10^{-1}$ | 36 |
| $0.88 * 10^{0}$ | 35.2 |

The invention claimed is:

1. A switching device comprising:
   a diamond body;
   at least one first metal contact in electrical contact to the diamond body, said first metal contact being a Schottky contact that is arranged to form a depletion region in an adjacent region of the diamond body when held in reverse bias by an applied voltage to be switched;
   at least one second metal contact in electrical contact to the diamond body arranged to carry a current from the switching device; and
   illuminating or irradiation means arranged to illuminate or irradiate the depletion region in the diamond body adjacent to the Schottky contact, thereby to commence generation of carriers that are capable of carrying a current in an avalanche mode,
   wherein the diamond body includes a portion of intrinsic diamond in contact with the at least one first metal contact, the intrinsic diamond including levels of impurities sufficiently low that the electronic properties are dominated by intrinsic carriers, which carriers have high carrier mobilities and lifetimes, and
   wherein the switching device is configured to hold the Schottky contact in reverse bias at a voltage close to an avalanche breakdown voltage and the illuminating or irradiating the depletion region is sufficient to push the switching device into assisted avalanche breakdown.

2. A switching device according to claim 1, wherein the at least one second metal contact is an ohmic contact.

3. A switching device according to claim 2, wherein the ohmic contact comprises a heavily doped diamond layer in combination with the second metal contact.

4. A switching device according to claim 1, wherein the intrinsic diamond portion comprises a layer of intrinsic diamond in the diamond body.

5. A switching device according to claim 4, wherein the layer of intrinsic diamond has a thickness sufficient to prevent spontaneous avalanche breakdown in the intrinsic diamond at the applied voltage in use.

6. A switching device according to claim 1, wherein the diamond body is a CVD diamond body.

7. A switching device according to claim 1, wherein the Schottky contact is semi-transparent to illumination or irradiation.

8. A switching device according to claim 7, wherein the Schottky contact comprises a perforated metal layer.

9. A switching device according to claim 1, wherein the total level of impurities in the intrinsic diamond portion in contact with the at least one first metal contact is below 5 ppm.

10. A switching device according to claim 9, wherein the total level of impurities in the intrinsic diamond portion is below 1 ppm.

11. A switching device according to claim 10, wherein the total level of impurities in the intrinsic diamond portion is below 0.3 ppm.

12. A switching device according to claim 11, wherein the total level of impurities in the intrinsic diamond portion is below 0.1 ppm.

13. A switching device according to claim 12, wherein the total level of impurities in the intrinsic diamond portion is below 0.03 ppm.

14. A switching device according to claim 13, wherein the total level of impurities in the intrinsic diamond portion is below 0.01 ppm.

15. A switching device according to claim 1, wherein the impurities in the intrinsic diamond portion in contact with the at least one first metal contact includes doping impurities selected from boron, phosphorus and sulphur, the level of doping impurities being less than 0.1 ppm.

16. A switching device according to claim 15, wherein the level of doping impurities is less than 0.03 ppm.

17. A switching device according to claim 16, wherein the level of doping impurities is less than 0.01 ppm.

18. A switching device according to claim 17, wherein the level of doping impurities is less than 0.003 ppm.

19. A switching device according to claim 18, wherein the level of doping impurities is less than 0.001 ppm.

20. A switching device according to claim 1, wherein the irradiation means comprises a source of electro-magnetic radiation.

21. A switching device according to claim 20, wherein the source of electro-magnetic radiation produces radiation lying in the range of 180 nm-500 nm wavelength.

22. A switching device according to claim 1, wherein the illuminating or irradiation means comprises an optical source that provides one or more selected wavelengths of light that generate carriers in the diamond.

23. A switching device according to claim 1, wherein the irradiation means comprises a source for producing x-rays, electrons or alpha particles.

24. A switching device according to claim 1, further comprising one or more carrier generation layers in the diamond body, which are arranged to enhance or modify the generation of charge carriers under suitable irradiation.

25. A switching device according to claim 24, wherein the one or more carrier generation layers is formed by impurities selected from hydrogen, boron, nitrogen and phosphorus.

26. A switching device according to claim 22, wherein one or more surfaces of the diamond body is/are angled or profiled to enhance the interaction of the optical source that can generate carriers with the depletion layer of the Schottky contact.

27. A switching device according to claim 24, wherein one or more surfaces of the diamond body are angled or profiled to enhance the interaction of the optical source that can generate carriers with the carrier generation layers.

28. A switching device according to claim 22, wherein the Schottky contact is perforated in such a way as to improve the interaction of the optical source with the diamond depletion region.

29. A switching device according to claim 28, wherein the characteristic scale of the perforations in the Schottky contact are similar to the absorption depth of the radiation in the diamond depletion region.

30. A switching device according to claim 22, wherein field enhancement features are designed into the Schottky contact to enable the avalanche breakdown threshold voltage to be controlled by optical means.

31. A switching device according to claim 22, which is operated using two or more non-zero levels of optical intensity, where these levels of optical intensity are at the same or different wavelengths.

32. A switching device according to claim 31, wherein the two or more levels of optical intensity are at the same wavelength.

33. A switching device according to claim 1, wherein the switching device is further configured to reduce the applied voltage after entering the assisted avalanche breakdown to a point just sufficient to sustain assisted avalanche breakdown and the removal of the illumination or irradiation causes the switching device to fall out of avalanche mode and switch off.

34. A method performed on a switching device according to claim 1, comprising the steps of:
holding the switching device in reverse bias at a voltage close to an avalanche breakdown voltage; and
illuminating or irradiating the depletion region to push the switching device into assisted avalanche breakdown.

35. The method according to claim 34, further comprising:
reducing the applied voltage after entering assisted avalanche breakdown to a point just sufficient to sustain assisted avalanche breakdown; and
removing the illumination or irradiation to fall out of avalanche mode and switch off.

* * * * *